United States Patent
Anasako

(10) Patent No.: US 6,774,542 B2
(45) Date of Patent: Aug. 10, 2004

(54) SAW DEVICE

(75) Inventor: Kenichi Anasako, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 142 days.

(21) Appl. No.: 10/254,796

(22) Filed: Sep. 26, 2002

(65) Prior Publication Data

US 2003/0155844 A1 Aug. 21, 2003

(30) Foreign Application Priority Data

Feb. 15, 2002 (JP) ........................ 2002-038191

(51) Int. Cl.⁷ ..................... H03H 9/25; H01L 41/047

(52) U.S. Cl. ................... 310/364; 310/313 R

(58) Field of Search ................. 310/363, 364, 310/313 R

(56) References Cited

U.S. PATENT DOCUMENTS

| | | | | |
|---|---|---|---|---|
| 5,774,962 A | * | 7/1998 | Satoh et al. | 29/25.35 |
| 6,486,591 B2 | * | 11/2002 | Nishihara | 310/364 |
| 6,545,388 B2 | * | 4/2003 | Iwamoto | 310/313 A |
| RE38,278 E | * | 10/2003 | Satoh et al. | 310/313 R |
| 6,657,366 B2 | * | 12/2003 | Watanabe et al. | 310/364 |
| 6,700,312 B2 | * | 3/2004 | Iizuka et al. | 310/364 |

FOREIGN PATENT DOCUMENTS

| | | | | |
|---|---|---|---|---|
| JP | 10-79638 | * | 3/1998 | H03H/3/08 |
| JP | 2003-163565 | * | 6/2003 | H03H/9/145 |

* cited by examiner

*Primary Examiner*—Thomas M. Dougherty
(74) *Attorney, Agent, or Firm*—Kanesaka & Takeuchi

(57) ABSTRACT

A surface acoustic wave (SAW) device comprises a piezoelectric substrate, at least one alloy layer made of aluminum (Al) and copper (Cu), at least one oxide layer, and at least one metal layer made of a metal other than Al, wherein the alloy layer, oxide layer, and metal layers are laminated one upon another.

21 Claims, 7 Drawing Sheets

SAW DEVICE

BACKGROUND OF THE INVETION

1. Field of the Invention

The present invention relates to a surface acoustic wave (SAW) device and, especially, to a structure of electrode layers of a SAW filter.

2. Description of the Related Art

A conventional SAW device is described in, for example, Japanese Patent Application Kokai No. 9-69748. FIGS. 7(a)–(c) show such a conventional SAW device.

In a band filter having a center frequency of 1.5 GHz, an electrode wire is required to have a width of 0.7 $\mu$m. When a large electric power is applied to the SAW device having such a fine electrode, the strain produced by the SAW causes a stress in the electrode layer. When this stress exceeds the critical limit stress of the electrode layer, the atoms of the electrode material, or aluminum (Al), move along the grain boundary. As a result, hillocks and voids are formed and the electrode is broken so that the characteristics of the SAW device deteriorate. To solve the problem, an aluminum alloy layer containing copper (Cu) has been used as the electrode material since the aluminum alloy layer withstands a larger electric power than the pure aluminum layer. Also, it has been attempted to reinforce the electrode layer by adding titanium (Ti), nickel (Ni), or palladium (Pd).

The device according to the prior art, however, does not achieve satisfactory electric power durability and low insertion loss for the electric power necessary for the transmission stage of a mobile telephone. For example, an analog cellular telephone is required to withstand application of an electric power of 1 W or more, and the insertion loss is as low as that of the common dielectric filter. However, it failed to achieve them.

In order to withstand a large electric power, the rate of an added metal may be increased. However, the increased metal causes an undesirable increase in the specific resistance of the alloy layer and the insertion loss.

Accordingly, it has been proposed to provide an SAW device comprising an inter-digital transducer (IDT) electrode capable of withstanding a large electric power application and preventing increase in the insertion loss.

According to the prior art, the IDT electrode provided on the surface of a piezoelectric substrate is formed by the alternate lamination of an Al layer and a layer made of a conductive material having an elastic constant greater than that of the Al layer. In addition, the number of the laminated layers of the conductive material and Al is two or more.

The thickness of each Al layer is 150 nm or less. The thickness of each layer of the conductive material having an elastic constant greater than that of the Al layer is smaller than that of the Al layer. As a result, an increase in electric resistance of the electrode is prevented, the mechanical strength of the electrode is increased, the production of the hillocks and voids is prevented, and the electrode withstands a larger electric power than before.

In addition, the outermost layer of the laminated electrode of the prior art is made of either the Al layer having a thickness of 50 nm or less or the layer of a conductive material having an elastic constant greater than that of the Al layer, so that the device prevents production of the hillocks and voids formed in the outermost layer and withstands a larger electric power than before.

The production mechanism of the hillocks and voids will be described below.

When the SAW device is excited, a strain is generated in a piezoelectric substrate, causing a stress applied to the IDT electrode. When the stress exceeds the limit of the layer, Al atoms in the electrode propagate through the grain boundary and move to the surface of the electrode to form the hillocks. When Al atoms move into the surface, the voids of the Al atoms are produced in the layer. When many hillocks and voids are produced, the electrode layer is broken, and fluctuation of the frequency and increase in the insertion loss occur, and finally the SAW device is unable to function properly.

Such production of hillocks and voids due to the movement of Al atoms decreases as the mechanical strength of the layer increases or the particle size of the Al layer decreases. Also, it is known that the movement of Al atoms is suppressed when atoms of Cu and Ti precipitate into the grain boundary. Accordingly, attempts have been made to add various materials. However, the amount of the addition was limited because the increased concentration of the added material increases the specific resistance of the layer, leading to a significant increase in the insertion loss.

According to the prior art, even if the concentration of the added material is increased in a single alloy layer, the grain boundary exists continuously from the interface of the piezoelectric substrate and electrode to the surface of the electrode. When stress applied to the electrode exceeds the limit of the alloy electrode, the Al atoms move up to the electrode surface through the grain boundary, thereby producing hillocks.

On the basis of such recognition, the prior art prevents not only the particle size of Al layer from increasing but also the Al atoms from moving up to the electrode surface through the grain boundary, by dividing the Al layer into a plurality of layers with a material having an elastic constant greater than that of the Al layer.

Furthermore, by providing a layer of material having an elastic constant larger than that of the Al layer between the Al layers, the elastic strength of the entire electrode layer is enhanced so that the electrode withstands a large stress. Incidentally, when the thickness of each of the laminated Al layers is large, the Al atoms move in the lateral direction due to the stress caused by excitation, and side hillocks are formed. The side hillocks cause not only deterioration of the electrode but also a short-circuit by contacting with the adjacent IDT electrodes.

A solution to the above problems is to reduce the thickness of the laminated Al layer. Experiments show that the thickness of the Al layer no more than 150 nm, preferably no more than 100 nm is sufficient to withstand electric power application of 1 W or more for use in the transmitter stage. Also, since a conductive material having an elastic constant greater than that of an Al layer generally has a density higher than that of the Al layer, it is preferred to form a conductive layer as thin as possible, at least thinner than the Al layer, which prevents increase of the electric resistance of the electrode.

In summary, the SAW device according to the prior art comprises a piezoelectric substrate and a comb-shaped IDT electrode provided on the surface of the piezoelectric substrate. The IDT electrode is composed of the first layer made of only Al and the second layer made of only a conductive material having an elastic constant and hardness greater than those of the first layer.

The IDT electrode comprises a plurality of the first layers and a plurality of the second layers. The thickness of the first layer is 150 nm or less and the thickness of the second layer is smaller than that of the first layer. That is, the barrier metal is made thin because of its large resistance. Thus, the second layer is made thin so that the device is not influenced by high-frequency waves.

In FIGS. 7(a)–7(c), the electrodes have different numbers of laminates. The sectional views illustrate only one IDT electrode. In the drawings, reference numbers 31 to 33, 35 to 38, and 40 to 45 are Al layers, and 51 to 52, 53 to 55, and 56 to 60 are conductive material layers having an elastic constant greater than that of the Al layers. As shown in FIG. 7(a), the IDT electrode 2 comprises the layers 31–33 and 51–52. The IDT electrode in FIG. 7(b) comprises layers 35–38 and 53–55. The IDT electrode in FIG. 7(c) comprises layers 40–45 and 56–60. The IDT electrode 2 is provided on a piezoelectric substrate of lithium tantalate 1.

It is noted that when an Al-1 Wt % Ti alloy layer or an Al-1 Wt % Cu alloy layer is employed in the electrode, hillocks are produced.

The prior art describes that if the electrode is composed by alternately laminating a layer made of only Al and a layer made of a conductive material having an elastic constant greater than that of the Al layer, the withstanding characteristic to electric power increases. However, nothing is described in the prior art about a naturally oxidized layer or an insulative layer. It is discovered that employing these layers in the electrode is effective in solving the above problems.

SUMMARY OF THE INVENTION

Accordingly, it is an object of the present invention to provide a SAW device using the naturally oxidized layer or insulative layer to improve the power withstanding characteristics and prevent the production of hillocks and voids.

According to the present invention, the following devices are provided.

(1) A surface acoustic wave (SAW) device comprises a piezoelectric substrate, at least one alloy layer made of aluminum (Al) and copper (Cu), at least one oxide layer, and at least one metal layer made of a metal other than Al, wherein the alloy layer, oxide layer, and metal layers are laminated one upon another.

(2) A surface acoustic wave (SAW) device according to the above para. (1), which further comprises a ground layer made of Chrome (Cr) or Titanium (Ti) and provided on the piezoelectric substrate.

(3) A surface acoustic wave (SAW) device according to the above para. (1), wherein the alloy layer, oxide layer, and metal layer are provided in this order from the piezoelectric substrate.

(4) A surface acoustic wave (SAW) device according to the above para. (1), wherein the alloy layer and metal layer are provided in this order from the piezoelectric substrate, and the oxide layer is interposed in the alloy layer.

(5) A surface acoustic wave (SAW) device according to the above para. (1), wherein the alloy layer, metal layer, and oxide layer are provided in this order from the piezoelectric substrate.

(6) A surface acoustic wave (SAW) device according to the above para. (1), wherein the alloy layer and oxide layer are provided in this order from the piezoelectric substrate, and the metal layer is provided as an uppermost layer.

(7) A surface acoustic wave (SAW) device comprises a piezoelectric substrate, at least one first metal layer made of a metal other than aluminum (Al) and copper (Cu), at least one second metal layer made of a metal other than Al, Cu, and the metal used in the first metal layer, and at least one alloy layer made of Al and Cu, wherein the first metal layer, second metal layer, and alloy layer are provided in this order from the piezoelectric substrate.

(8) A surface acoustic wave (SAW) device comprises a piezoelectric substrate, at least one first metal layer made of a metal other than aluminum (Al) and copper (Cu), at least one oxide layer, at least one second metal layer made of a metal other than Al, Cu, and the metal used in the first metal layer, and at least one alloy layer made of Al and Cu, wherein the first metal layer, oxide layer, second metal layer, and alloy layer are provided in this order from the piezoelectric substrate.

(9) A surface acoustic wave (SAW) device according to one of the above para. (1)–(6) and (8), wherein the oxide layer is a naturally oxidized layer.

(10) A surface acoustic wave (SAW) device according to one of the above para. (1)–(2), wherein the alloy layer is made by sputtering.

(11) A surface acoustic wave (SAW) device according to one of the above para. (1)–(2), wherein the metal layer is made of titanium (Ti).

(12) A surface acoustic wave (SAW) device according to one of the above para. (7)–(8), wherein the first metal layer is made of chrome (Cr) and the second metal layer is made of titanium (Ti).

DESCRIPTION OF THE PREFERRED EMBODIMENTS

Electrode layers of different materials according to embodiments of the invention will be described with reference to the accompanying drawings.

First Embodiment (The Electrode Comprises a Ground Layer Made of Cr or Ti, an Alloy Layer Made of Al and Cu, an Oxide Layer, and a Metal Layer Made of a Metal other than Al Formed in this Order on a Substrate.)

Figure 1:
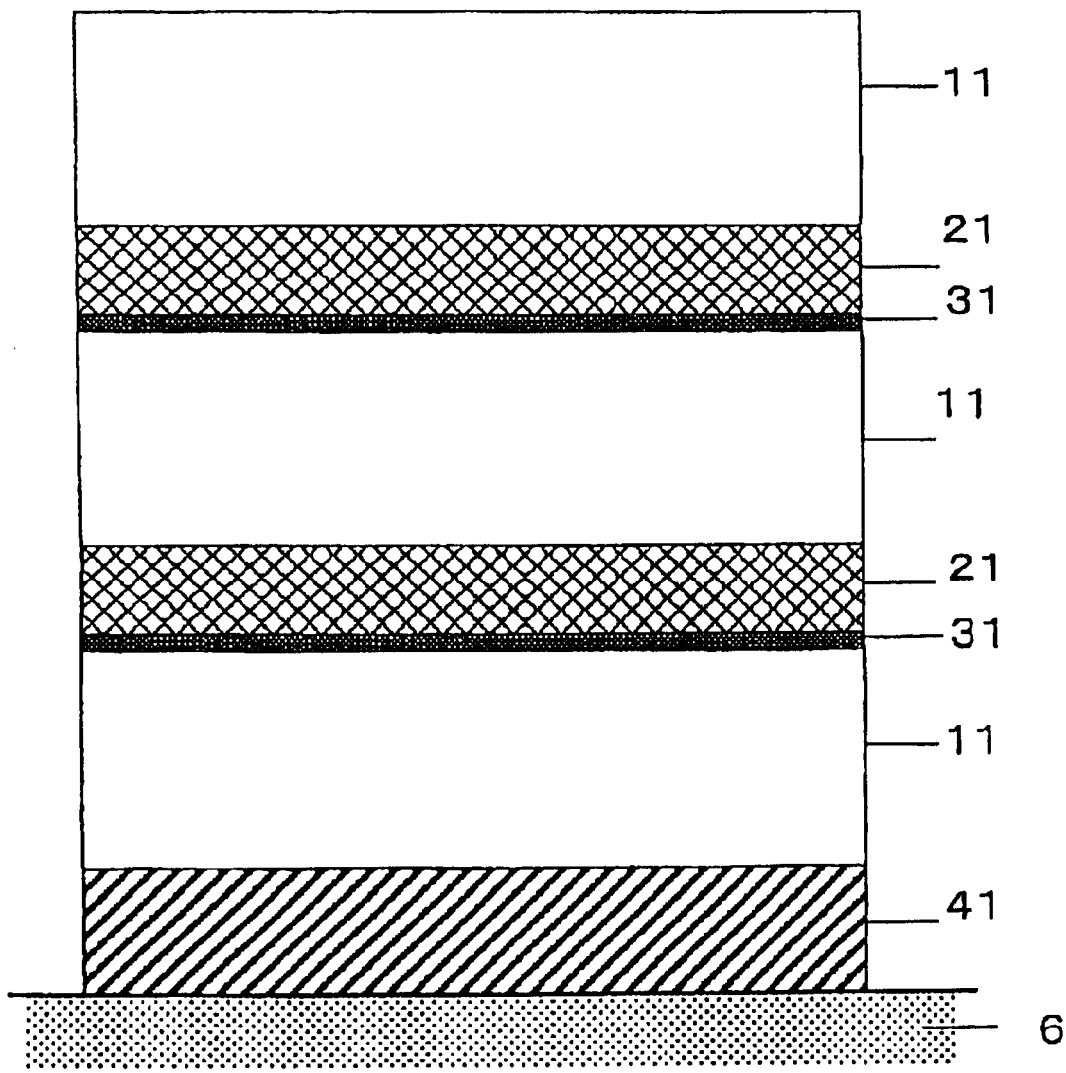
FIG. 1 is a sectional view showing the first embodiment of the invention.

According to the first embodiment in FIG. 1, the electrode comprises a ground layer 41 made of Cr or Ti, an alloy layer 11 made of Al and Cu such as an alloy layer containing Al and 0.5 Wt % Cu (hereinafter "Al-0.5 Wt % Cu alloy layer 11"), a naturally oxidized layer 31, and a metal layer 21 made of a metal other than Al such as Ti layer 21 (hereinafter "Ti layer 21") formed in this order on a LiTaO$_3$ substrate 6. Practically, another layered structure of an Al-0.5 Wt % Cu alloy layer 11, a naturally oxidized layer 31, a Ti layer 21, and another Al-0.5 Wt % Cu alloy layer 11 is formed on the above layered structure.

Manufacturing Method of the First Embodiment

The ground layer 41 of Cr or Ti is formed on the LiTaO$_3$ substrate 6 by 150 Å sputtering. Then, the Al-0.5 Wt % Cu alloy layer 11 is formed on the ground layer 41 by sputtering. After that, the wafer is exposed to the air so that the surface of the Al-0.5 Wt % Cu alloy layer 11 is oxidized to form the naturally oxidized layer 31.

The Ti layer 21 and another Al-0.5 Wt % Cu alloy layer 11 are formed on the naturally oxidized layer 31 by sputtering. Then, the wafer is exposed to the air so that the surface of the Al-0.5 Wt % Cu alloy layer 11 is oxidized to form the naturally oxidized layer 31. Another Ti layer 21 and Al-0.5 Wt % Cu alloy layer 11 are formed on the naturally oxidized layer 31 by sputtering.

One method for exposing the wafer is to communicate the inside of a chamber to the air so that the same chamber can be used for the exposure. Thus, the naturally oxidized layer 31 is formed between the Al-0.5 Wt % Cu alloy layer 11 and the Ti layer 21. Then, a comb-shaped electrode and a reflector of SAW device, and a conductor pattern to connect them are formed by etching the wafer.

Control of Hillocks and Voids

The electric power withstanding characteristics of a SAW filter depends on the hillocks and voids in the electrode produced by a high-frequency wave vibration. When an electrode layer is formed by sputtering, the metal crystal of the electrode layer is not oriented in a single direction but various directions. The sputtering forms the layer too rapidly for the surface of the crystal to become uniform. If a layer is formed more slowly by a method other than sputtering, the crystal is well oriented to be uniform.

When an electrode layer is formed by sputtering, it is in an unstable state. Consequently, the activation energy necessary for movement of the particles is so low that hillocks and voids are readily produced. The natural oxide of aluminum, alumina $Al_2O_3$ is an insulative material. Accordingly, the movement of the particles of Al or an Al alloy is stopped by the naturally oxidized layer, thereby controlling the production of hillocks and voids. The naturally oxidized layer is formed so thin that it makes a capacitor for high-frequency waves and becomes conductive.

According to the first embodiment, the ground layer 41 made of Cr or Ti is formed by sputtering or evaporation on the LiTaO$_3$ substrate 6, and the Al-0.5 Wt % Cu alloy layer 11 is formed on the ground layer 41. Then, the wafer is exposed to the air so that the naturally oxidized layer 31 of Al is formed.

The naturally oxidized layer of Al, alumina $Al_2O_3$ is an insulative material and stable enough to be used for a ceramic. Once alumina $Al_2O_3$ is produced, it is not returned to Al or Al alloy. Accordingly, the movement of particles of Al or Al alloy is stopped by the naturally oxidized layer 31, and the particles do not penetrate the naturally oxidized layer 31, thus suppressing the production of hillocks and voids. A metal other than Al has the same effect, but the effect is especially remarkable in the case of alumina $Al_2O_3$.

The naturally oxidized layer 31 is an insulator formed between two conductors, Al or Al alloy and Ti, and is so thin that it makes a capacitor for high-frequency waves, conducing electricity. Since the capacitor is formed inside the conductor, the electrical circuit can be made small. The interval and height of the electrodes are usually limited due to the fixed value of the output impedance of a SAW device. However, if the capacitor is formed inside the conductor, the limitation to the interval and height of the electrodes is minimized, and the design freedom of the electrodes is increased, thereby making it possible to produce a small circuit.

After another Ti layer 21 and an Al-0.5 Wt % Cu alloy layer 11 are formed by sputtering, the surface of the Al-0.5 Wt % Cu alloy layer 11 is turned to the naturally oxidized layer 31 by the second exposing process of the wafer. The exposing process may be repeated a number of times. The process for forming the electrode layers is finished by forming the Ti layer 21 and the Al-0.5 Wt % Cu alloy layer 11. Then, the comb-shaped electrode is formed by photolithography and etching processes. The exposing process makes it possible to use a plurality of machines efficiently in mass-production. Although only six or seven targets are put in a chamber, wafers are moved to another chamber during the exposing process and, therefore, as many chambers as the number of the exposing steps can be used.

Another method for the exposing process is to communicate the inside of the chamber to air. With this method, the process is simplified and the naturally oxidized layer is readily formed. When a certain number of target materials are changed in a chamber, another chamber is necessary. However, since only a few kinds of targets are used in the invention, the number of necessary chambers is small.

Second Embodiment (The Electrode Comprises a Ground Layer of Cr or Ti, a First Alloy Layer Made of Al and Cu, an Oxide Layer, a Second Alloy Layer Made of Al and Cu, and a Metal Layer Made of a Metal other than Al Formed in this Order on a Substrate.)

Figure 2:
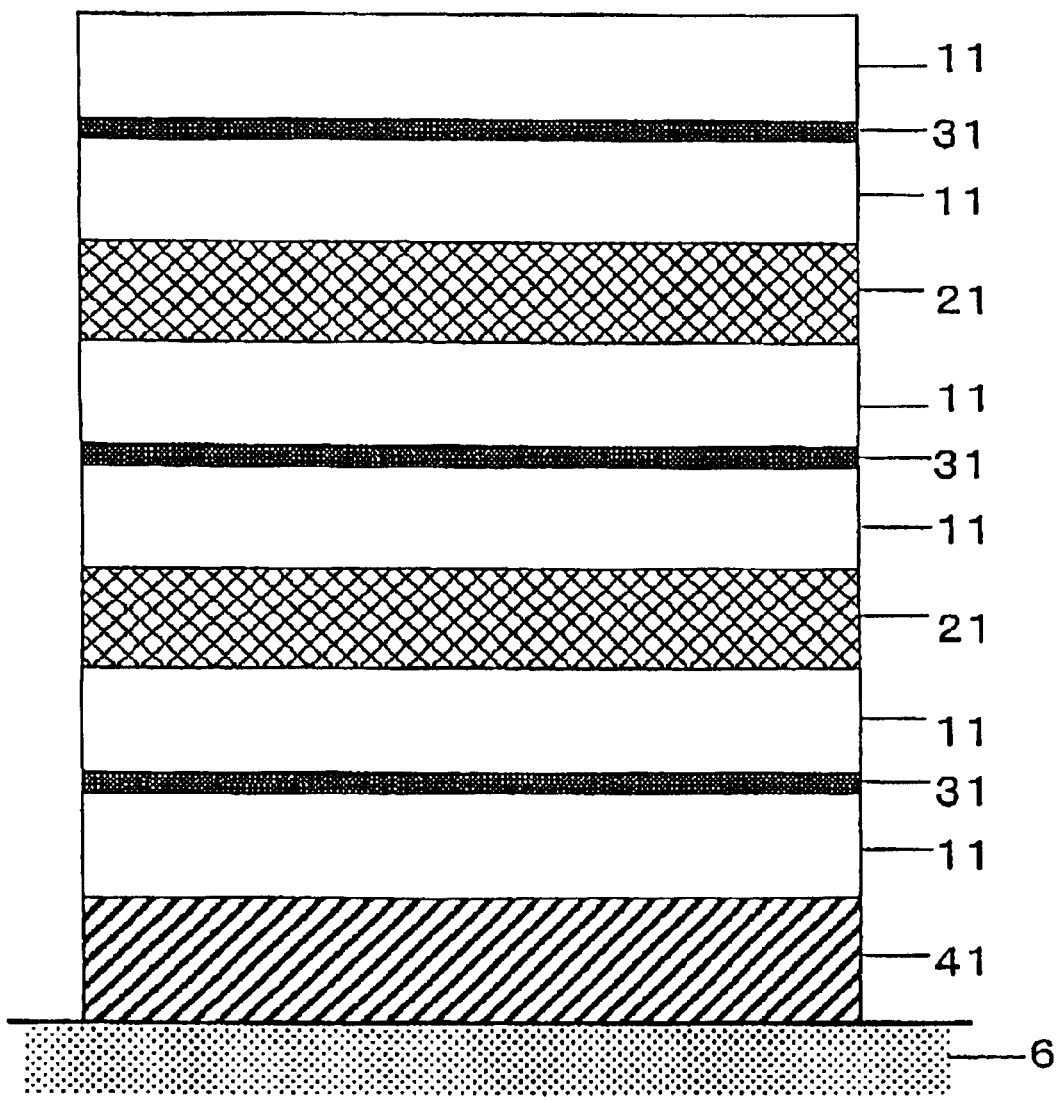
FIG. 2 is a sectional view showing the second embodiment of the invention.

According to the second embodiment of the invention in FIG. 2, a ground layer 41 made of Cr or Ti, a first alloy layer 11 of Al and Cu, such as Al-0.5 Wt % Cu alloy layer 11, a naturally oxidized layer 31, a second alloy layer 11' made of Al and Cu, such as Al-0.5 Wt % Cu alloy layer 11', and a metal layer 21 made of a metal other than Al, such as Ti layer 21, are formed in this order on a LiTaO$_3$ substrate 6. Practically, another laminate of a Al-0.5 Wt % Cu alloy layer 11 as the first alloy layer, a naturally oxidized layer 31, an Al-0.5 Wt % Cu alloy layer 11 as the second alloy layer, and a Ti layer 21 is formed. Still another laminate of a Al-0.5 Wt % Cu alloy layer 11 as the first alloy layer, a naturally oxidized layer 31, and an Al-0.5 Wt % Cu alloy layer 11 as the second alloy layer may be further formed.

Manufacturing Method of the Second Embodiment

The ground layer 41 of Cr or Ti is formed on the LiTaO$_3$ substrate 6 by 150 Å sputtering. Then, the Al-0.5 Wt % Cu alloy layer 11 is formed as the first alloy layer on the ground layer 41 by sputtering. After that, the wafer is exposed to the air so that the surface of the Al-0.5 Wt % Cu alloy layer 11 is oxidized to provide the naturally oxidized layer 31. The Al-0.5 Wt % Cu alloy layer 11 is formed as the second alloy layer on the naturally oxidized layer 31 by sputtering. The Ti layer 21 is formed on the Al-0.5 Wt % Cu alloy layer 11 by sputtering.

Another Al-0.5 Wt % Cu alloy layer 11 is formed as the first alloy layer on the Ti layer 21 by sputtering. Then, the wafer is exposed to the air so that the surface of the Al-0.5 Wt % Cu alloy layer 11 is oxidized to provide the naturally oxidized layer 31. Still another Al-0.5 Wt % Cu alloy layer 11 is formed as the second alloy layer on the naturally oxidized layer 31 by sputtering. Then, the Ti layer 21 and the Al-0.5 Wt % Cu alloy layer 11 as the first alloy layer are formed on the Al-0.5 Wt % Cu alloy layer 11 as the second alloy layer. After that, the wafer is exposed to the air so that the surface of the Al-0.5 Wt % Cu alloy layer 11 is oxidized to provide the naturally oxidized layer 31. Then, the Al-0.5 Wt % Cu alloy layer 11 is formed as the second alloy layer on the naturally oxidized layer 31. Thus, the naturally oxidized layer 31 is formed between the two Al-0.5 Wt % Cu alloy layers 11.

The process of exposing the wafer is achieved by communicating the inside of a chamber to the air so that the same chamber can be used for the exposing process.

According to the second embodiment, the ground layer 41 of Cr or Ti is formed on the $LiTaO_3$ substrate 6. Then, the Al-0.5 Wt % Cu alloy layer 11 is formed as the first alloy layer on the ground layer 41. After that, the wafer is exposed to the air so that the surface of the Al-0.5 Wt % Cu alloy layer 11 is oxidized. Then, the Al-0.5 Wt % Cu alloy layer 11 as the second alloy layer and the Ti layer 21 are formed. Then, the Al-0.5 Wt % Cu alloy layer 11 is formed as the first alloy layer again. After that, the wafer is exposed to the air so that the naturally oxidized layer 31 is formed. Thus, the exposing process is repeated a plurality of times to form the naturally oxidized layers 11 and the entire process is completed by forming the Al-0.5 Wt % Cu alloy layer 11 on the naturally oxidized layer 31.

Control of Hillocks and Voids

The second embodiment operates in the same way as the first embodiment. That is, the natural oxide of aluminum, alumina $Al_2O_3$, is an insulative material so that the movement of particles of the Al or Al alloy is stopped by the naturally oxidized layer 31, thereby suppressing the production of hillocks and voids. The naturally oxidized layer 31 is formed so thin that it forms a capacitor for high-frequency waves and becomes conductive. The second embodiment has the same effect as the first embodiment. In addition, since the naturally oxidized layer 31 is formed between the two Al-0.5 Wt % Cu alloy layers 11, the naturally oxidized layer 31 has stable characteristics.

Third Embodiment (The Electrode Comprises a Ground Layer of Cr or Ti, an Alloy Layer Made of Al and Cu, a Metal Layer Made of a Metal other than Al, and an Oxide Layer Formed in this Order on a Substrate.)

Figure 3:
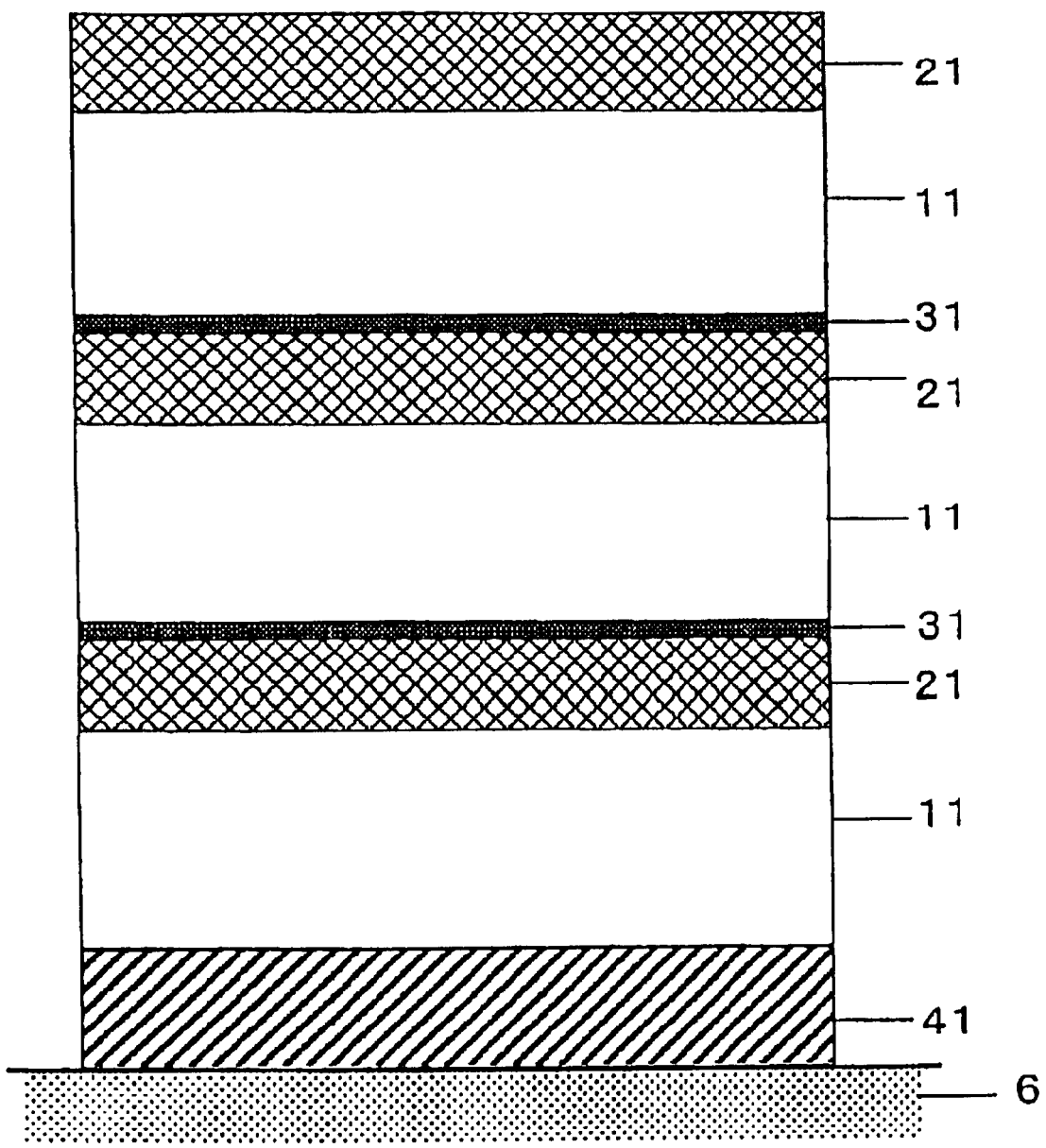
FIG. 3 is a sectional view showing the third embodiment of the invention.

According to the third embodiment in FIG. 3, the electrode basically comprises a ground layer 41 of Cr or Ti, an alloy layer made of Al and Cu, such as an Al-0.5 Wt % Cu alloy layer 11, a metal layer made of a metal other than Al, such as a Ti layer 21, and a naturally oxidized layer 31 formed in this order on a $LiTaO_3$ substrate 6. Practically, another laminate of a Al-0.5 Wt % Cu alloy layer 11, a Ti layer 21, a naturally oxidized layer 31 is formed on the above layered structure. Still another laminate of a Al-0.5 Wt % Cu alloy layer 11 and a Ti layer 21 may be further formed.

Manufacturing Method of the Third Embodiment

The ground layer 41 of Cr or Ti is formed on the $LiTaO_3$ substrate 6 by 150 Å sputtering. Then, the Al-0.5 Wt % Cu alloy layer 11 is formed on the ground layer 41 by sputtering. Then, the Ti layer 21 is formed by sputtering. After that, the wafer is exposed to the air so that the surface of the Ti layer 21 is oxidized to provide the naturally oxidized layer 31.

Another Al-0.5 Wt % Cu alloy layer 11 is formed by sputtering. Then, a Ti layer 21 is formed on the Al-0.5 Wt % Cu alloy layer 11 by sputtering. After that, the wafer is exposed to the air so that the surface of the Ti layer 21 is oxidized to provide to the naturally oxidized layer 31. Still another laminate of a Al-0.5 Wt % Cu alloy layer 11 and a Ti layer 21 is formed by sputtering.

The process of exposing the wafer is communicating the inside of a chamber to the air so that the same chamber can be used for the exposing process.

According to the third embodiment, the ground layer 41 of Cr or Ti is formed on the $LiTaO_3$ substrate 6, the Al-0.5 Wt % Cu alloy layer 11 is formed on the ground layer 41, and the Ti layer 21 is formed on the Al-0.5 Wt % Cu alloy layer 11. After that, the wafer is exposed to the air so that the surface of the Ti layer 21 is oxidized to provide the naturally oxidized layer 31.

Another laminate of a Al-0.5 Wt % Cu alloy layer 11 and a Ti layer 21 is formed and, then, the wafer is exposed to the air so that the surface of the Ti layer 21 is oxidized to provide the naturally oxidized layer 31.

The exposing process is repeated a plurality of times to form the naturally oxidized layers 11, and the entire process is finished by forming the Al-0.5 Wt % Cu alloy layer 11 and the Ti layer 21.

Control of Hillocks and Voids

The third embodiment operates in the same way as the first embodiment. That is, the natural oxide of aluminum, alumina $Al_2O_3$, is an insulative material so that the movement of particles of the Al or Al alloy is stopped by the naturally oxidized layer 31, thereby suppressing the production of hillocks and voids. The naturally oxidized layer 31 is formed so thin that it makes a capacitor and becomes conductive for high-frequency waves. The third embodiment has the same effect as the first embodiment.

Fourth Embodiment (The Electrode Comprise a Ground Layer of Cr or Ti, an Alloy Layer Made of Al and Cu, an Oxide Layer, an Alloy Layer Made of Cr and Ti, and a Metal Layer Made of a Metal other than Al Formed in this Order on a Substrate.)

Figure 4:
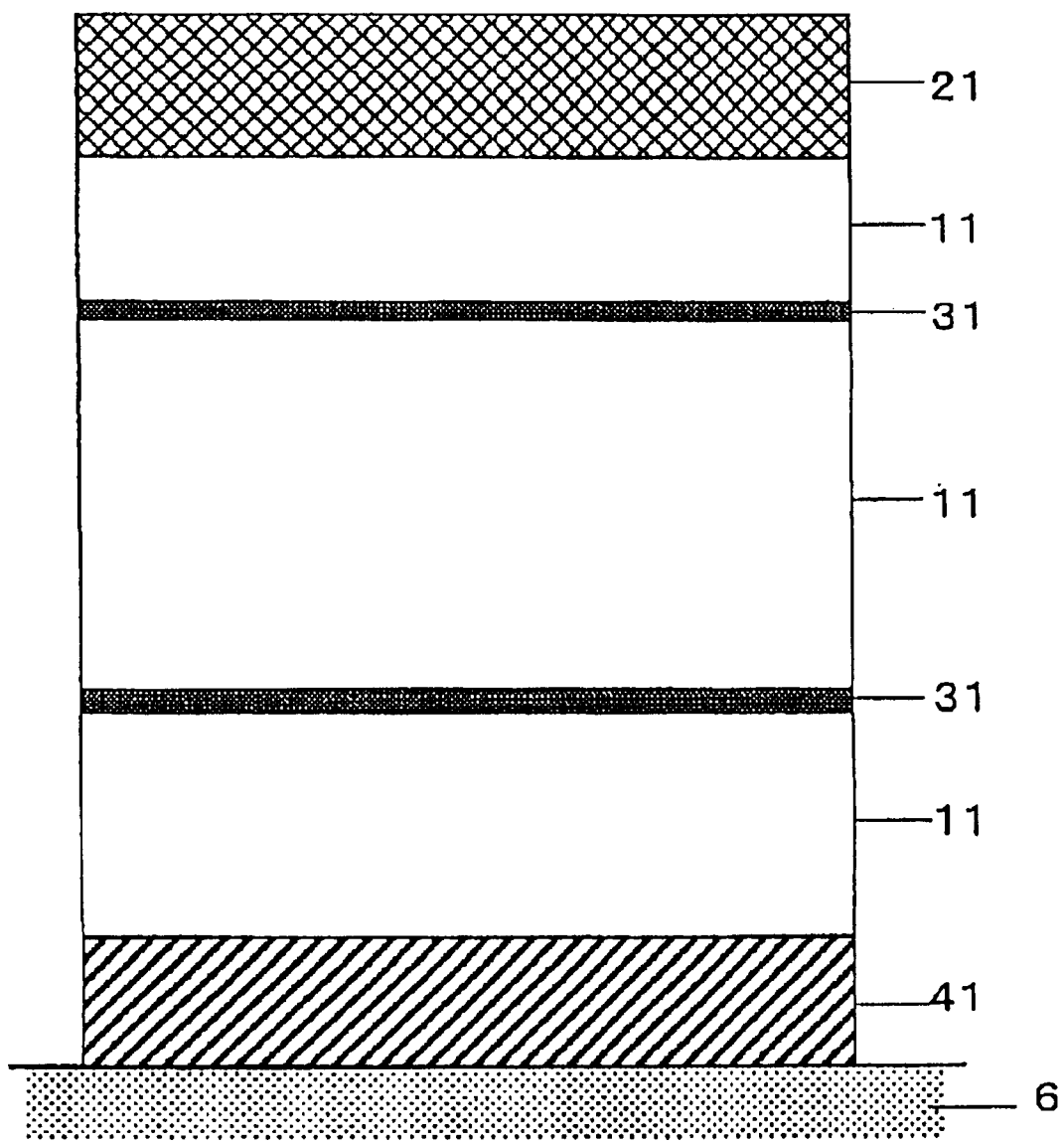
FIG. 4 is a sectional view showing the fourth embodiment of the invention.

According to the fourth embodiment in FIG. 4, the electrode comprises a ground layer 41 of Cr or Ti, an alloy layer made of Al and Cu, such as a Al-0.5 Wt % Cu alloy layer 11, a naturally oxidized layer 31, another Al-0.5 Wt % Cu alloy layer 11, and a metal layer made of a metal other than Al, such as a Ti layer 21, formed in this order on a $LiTaO_3$ substrate 6.

Manufacturing Method of the Fourth Embodiment

The ground layer 41 of Cr or Ti is formed on the $LiTaO_3$ substrate 6 by 150 Å sputtering. Then, the Al-0.5 Wt % Cu alloy layer 11 is formed on the ground layer 41 by sputtering. After that, the wafer is exposed to the air so that the surface of the Al-0.5 Wt % Cu alloy layer 11 is oxidized to provide the naturally oxidized layer 31. Another Al-0.5 Wt % Cu alloy layer 11 is formed on the naturally oxidized layer 31 by sputtering. After that, the wafer is exposed to the air so that the surface of the Al-0.5 Wt % Cu alloy layer 11 is oxidized to provide the naturally oxidized layer 31. Still another Al-0.5 Wt % Cu alloy layer 11 is formed on the naturally oxidized layer 31 by sputtering. Then, a Ti layer 21 is formed on the Al-0.5 Wt % Cu alloy layer 11 by sputtering.

The process of exposing the wafer is made by communicating the inside of a chamber to the air so that the same chamber can be used for the exposing process. Thus, the naturally oxidized layer 31 is formed between the two Al-0.5 Wt % Cu alloy layers 11. Then, a comb-shaped electrode and a reflector of SAW device, and a conductor pattern to connect them are formed by etching the wafer.

According to the fourth embodiment, the ground layer 41 of Cr or Ti and the Al-0.5 Wt % Cu alloy layer 11 are formed on the $LiTaO_3$ substrate 6. After that, the wafer is exposed to the air so that the surface of the Al-0.5 Wt % Cu alloy layer 11 is oxidized. Another Al-0.5 Wt % Cu alloy layer 11 is formed on the naturally oxidized layer 31 and the wafer is exposed to the air again to form the naturally oxidized layer 31. The process of exposing the wafer is repeated a plurality of times and the Ti layer 21 is formed as the final step.

Control of Hillocks and Voids

The fourth embodiment operates in the same way as the first embodiment. That is, the natural oxide of aluminum, alumina $Al_2O_3$, is an insulative material so that the movement of particles of the Al or Al alloy is stopped by the naturally oxidized layer 31, thereby suppressing the production of hillocks and voids. The naturally oxidized layer 31 is formed so thin that it makes a capacitor for high-frequency waves and becomes conductive.

The fourth embodiment has the same effect as the first embodiment. In addition, the naturally oxidized layer 31 is formed between the two Al-0.5 Wt % Cu alloy layers 11, providing stable characteristics.

Fifth Embodiment (The Electrode Comprises a First Metal Layer of a Metal other than Al or Cu, a Second Metal Layer Made of a Metal other than Al, Cu, or the Metal Used in the First Metal Layer, and an Alloy Layer Made of Al and Cu Formed in this Order on a Substrate.)

Figure 5:
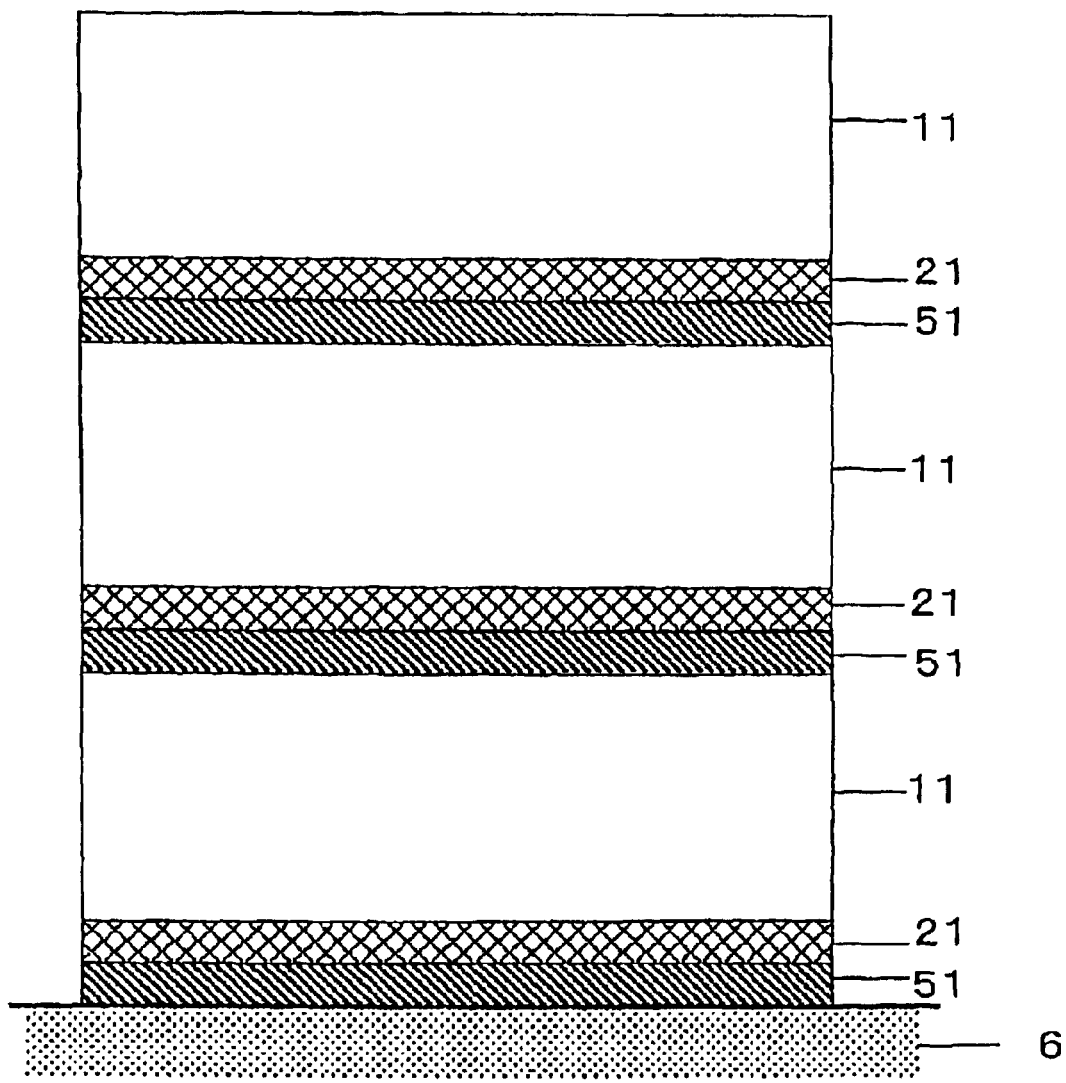
FIG. 5 is a sectional view showing the fifth embodiment of the invention.

According to the fifth embodiment in FIG. 5, the electrode basically comprises a first metal layer of a metal other than Al or Cu, such as a Cr layer 51 (hereinafter "Cr layer 51"), a second metal layer made of a metal other than Al, Cu, or the metal used in the first metal layer, such as a Ti layer 21, and an Al-0.5 Wt % Cu alloy layer 11 formed in this order on a $LiTaO_3$ substrate 6. Practically, another laminate of a Cr layer 51 as the first metal layer, a Ti layer 21 as the second metal layer, a Al-0.5 Wt % Cu alloy layer 11 is formed on the above layered structure. Still another laminate of a Cr layer 51 as the first metal layer, a Ti layer 21 as the second metal layer, and a Al-0.5 Wt % Cu alloy layer 11 may be further formed.

Manufacturing Method of the Fifth Embodiment

The Cr layer 51 as the first metal layer is formed on the $LiTaO_3$ substrate 6. Then, the Ti layer 21 as the second metal layer is formed on the Cr layer 51. Then, the Al-0.5 Wt % Cu alloy layer 11 is formed on the Ti layer 21 by sputtering. Then, another laminate of a Cr layer 51 as the first metal layer and a Ti layer 21 as the second metal layer is formed to make a two-layer barrier metal.

Then, the Al-0.5 Wt % Cu alloy layer 11 is formed on the Ti layer 21 by sputtering. Then, still another laminate of a Cr layer 51 as the first metal layer and a Ti layer 31 as the second metal layer is formed on the Al-0.5 Wt % Cu alloy layer 11 to make another two-layers barrier metal. The process of making the two-layer barrier metal is repeated a plurality of times and the Al-0.5 Wt % Cu alloy layer 11 is formed on the barrier metal as the final step.

The barrier metal may be formed by depositing various kinds of metals. Since hillocks of Al are produced by the movement of Al particles, any metal other than Al may be used as a material of the barrier metal. An electronic migration and stress migration are both controlled by the barrier metal.

Control of Hillocks and Voids

According to the fifth embodiment, the movement of particles of the Al or Al alloy is stopped by the barrier metal of the Cr layer and the Ti layer, thereby suppressing the production of hillocks and voids. The effect on the control of hillocks by the barrier metal depends on the kind of metals used in the barrier metal, but even a thin barrier metal has good effect on the control of hillocks. Both electronic migration and stress migration are controlled by the combination of metals.

Sixth Embodiment (The Electrode Comprises a First Metal Layer Made of a Metal other than Al or Cu, an Oxide Layer, a Second Metal Layer Made of a Metal other than Al, Cu, or the Metal Used in the First Metal Layer, and an Alloy Layer Made of Al and Cu Formed in this Order on a Substrate.)

Figure 6:
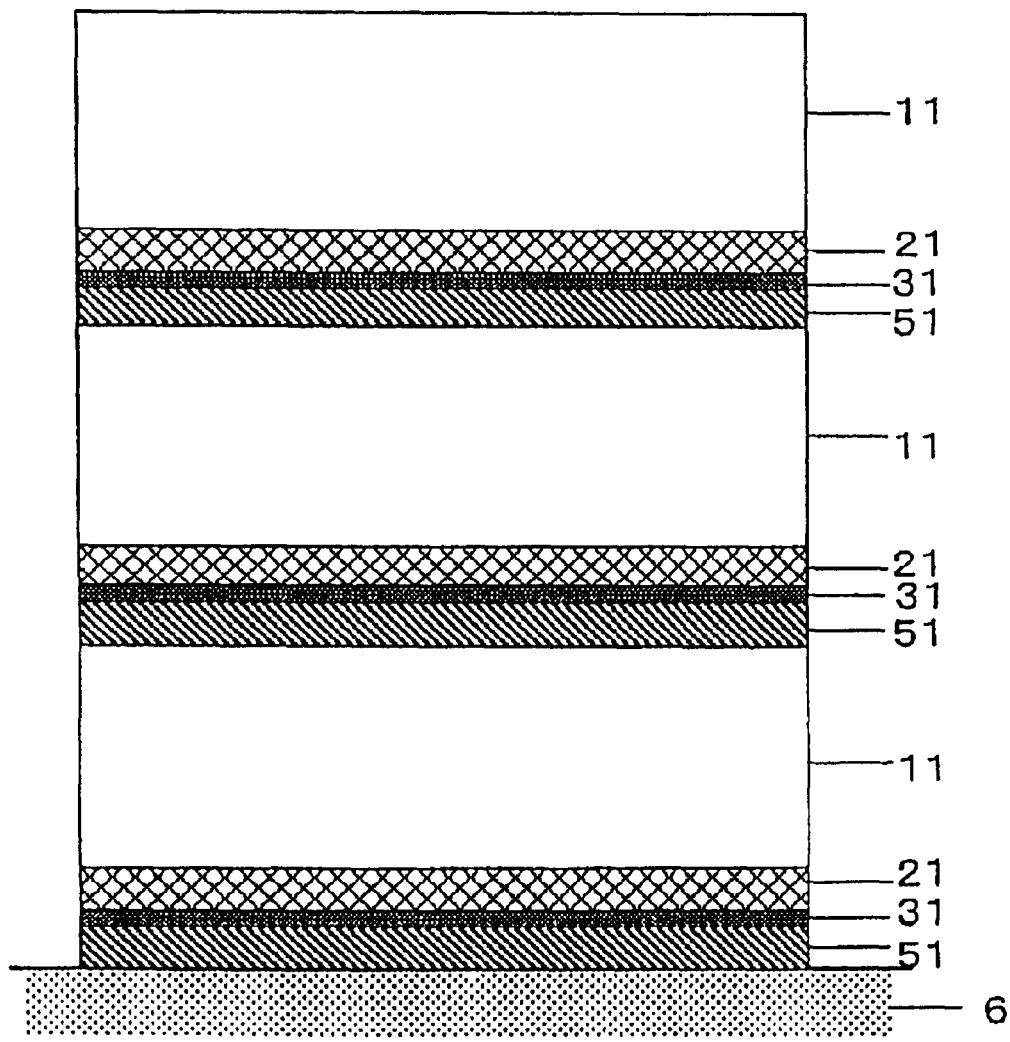
FIG. 6 is a sectional view showing the sixth embodiment of the invention.
Figure 7A:
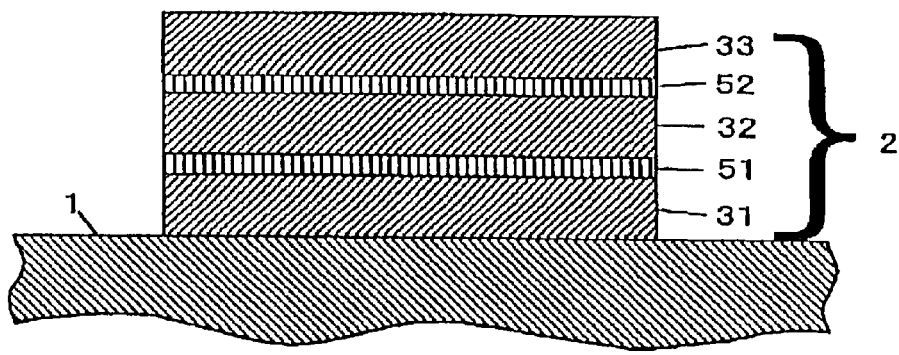
FIG. 7 is a sectional view showing the prior art.
Figure 7B:
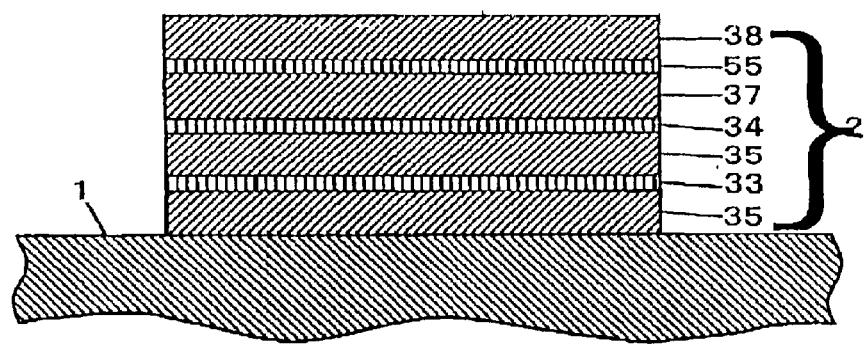
Figure 7C:
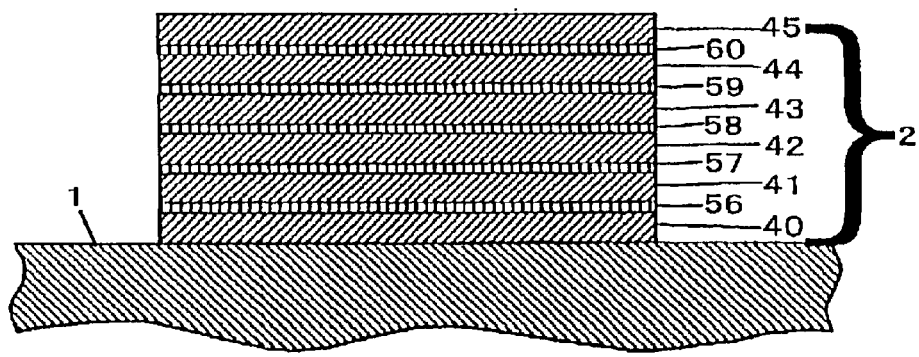

According to the sixth embodiment in FIG. 6, the electrode comprises a first metal layer made of a metal other than Al or Cu, such as a Cr layer 51, a naturally oxidized layer 31, a second metal layer made of a metal other than Al, Cu, or the metal used in the first metal layer, such as a Ti layer 21, and an alloy layer, such as an Al-0.5 Wt % Cu alloy layer 11, formed in this order on a $LiTaO_3$ substrate 6. practically, another laminate of a Cr layer 51 as the first metal layer, a naturally oxidized layer 31, a Ti layer 21 as the second metal layer, and a Al-0.5 Wt % Cu alloy layer 11 is formed. Still another laminate of a Cr layer 51 as the first metal layer, a naturally oxidized layer 31, a Ti layer 21 as the second metal layer, and a Al-0.5 Wt % Cu alloy layer 11 may be further formed.

Manufacturing Method of the Sixth Embodiment

The Cr layer 51 as the first metal layer is formed on the $LiTaO_3$ substrate 6 by 150 Å sputtering. After that, the wafer is exposed to the air so that the surface of the Cr layer 51 is oxidized to provide the naturally oxidized layer 31. Then, the Ti layer 21 as the second metal layer is formed on the naturally oxidized layer 31 by sputtering. Then, the Al-0.5 Wt % Cu alloy layer 11 is formed on the Ti layer 21 by sputtering. Then, another Cr layer 51 as the first metal layer is formed on the Al-0.5 Wt % Cu alloy layer 11 by sputtering.

After that, the wafer is exposed to the air so that the surface of the Cr layer 51 is oxidized to provide the naturally oxidized layer 31.

Then, another Ti layer 21 as the second metal layer is formed on the naturally oxidized layer 31 by sputtering. Then, another Al-0.5 Wt % Cu alloy layer 11 is formed on the Ti layer 21 by sputtering. Then, still another Cr layer 51 is formed on the Al-0.5 Wt % Cu alloy layer 11 by sputtering. After that, the wafer is exposed to the air so that the surface of the Cr layer 51 is oxidized to provide the naturally oxidized layer 31.

Still another laminate of a Ti layer 21 as the second metal layer and a Al-0.5 Wt % Cu alloy layer 11 is formed by sputtering.

The process of exposing the wafer is communicating the inside of a chamber to the air so that the same chamber can be used for the exposing process. Thus, the naturally oxidized layer 31 is formed between the Cr layer 51 and the Ti layer 21. Then, a comb-shaped electrode and a reflector of a SAW device, and a conductor pattern to connect them are formed by etching the wafer.

According to the sixth embodiment, after the Cr layer 51 is formed on the $LiTaO_3$ substrate 6, the wafer is exposed to the air so that the surface of the Cr layer 51 is oxidized to provide the naturally oxidized layer 31. Then, Ti layer 21 is formed. After the Al-0.5 Wt % Cu alloy layer 11 and another Cr layer 51 are formed, the wafer is exposed to the air so that the surface of the Cr layer 51 is oxidized and another Ti layer 21 is formed. The processes of forming the Al-0.5 Wt % Cu alloy layer 11 and Cr layer 51, exposing the wafer, and forming the Ti layer 21 are repeated a plurality of times and the Al-0.5 Wt % Cu alloy layer 11 is formed as the final step.

Control of Hillocks and Voids

According to the sixth embodiment, the movement of particles of the Al or Al alloy is stopped by the barrier metal layer of the Cr layer 51 and the Ti layer 21, and the naturally oxidized layer 31, thereby suppressing the production of hillocks and voids. The effect on the control of hillocks by the naturally oxidized layer 31 and the barrier metal of the Cr layer 51 and the Ti layer 21 varies with the kind of the naturally oxidized layer 31 and metals used in the barrier metal, but even a thin naturally oxidized layer 31 and barrier metal have good effect on the control of hillocks. Electronic migration and stress migration are both controlled by the combination of the metals.

Other Embodiment

A metal such as palladium, molybdenum, tungsten, tantalum, niobium, zirconium, hafnium, vanadium, nickel, silver, titanium carbide, nickel chromium, or titanium nitride having an elastic constant greater than that of Al may be used in an electrode layer in addition to Ti, Cu, or Cr. An example of the substrate is a mono-crystal substrate such as lithium niobate, lithium tetraborate, or crystal quartz, or a piezoelectric substrate made by forming a zinc oxide layer on a sapphire substrate. According to the invention, the electrode comprises a naturally oxidized layer or barrier metal layer, production of hillocks and void can be controlled. In addition, since the Al or conductive layer made of a material having an elastic constant greater than that of the Al layer is used, the withstanding strength to electric power is increased and the insertion resistance is reduced.

What is claimed is:

1. A surface acoustic wave (SAW) device comprising:
   a piezoelectric substrate;
   at least one alloy layer made of aluminum (Al) and copper (Cu);
   at least one oxide layer; and
   at least one metal layer made of a metal other than Al, wherein said alloy layer, oxide layer, and metal layers are laminated one upon another.

2. The surface acoustic wave (SAW) device according to claim 1, which further comprises a ground layer made of Chrome (Cr) or Titanium (Ti) and provided on said piezoelectric substrate.

3. The surface acoustic wave (SAW) device according to claim 1, wherein said alloy layer, oxide layer, and metal layer are provided in this order from said piezoelectric substrate.

4. The surface acoustic wave (SAW) device according to claim 1, wherein said alloy layer and metal layer are provided in this order from said piezoelectric substrate, and said oxide layer is interposed in said alloy layer.

5. The surface acoustic wave (SAW) device according to claim 1, wherein said alloy layer, metal layer, and oxide layer are provided in this order from said piezoelectric substrate.

6. The surface acoustic wave (SAW) device according to claim 1, wherein said alloy layer and oxide layer are provided in this order from said piezoelectric substrate and said metal layer is provided as an uppermost layer.

7. A surface acoustic wave (SAW) device comprising:
   a piezoelectric substrate;
   at least one first metal layer made of a metal other than aluminum (Al) and copper (Cu);
   at least one second metal layer made of a metal other than Al, Cu, and said metal used in said first metal layer; and
   at least one alloy layer made of Al and Cu, wherein said first metal layer, second metal layer, and alloy layer are provided in this order from said piezoelectric substrate.

8. A surface acoustic wave (SAW) device comprising:
   a piezoelectric substrate;
   at least one first metal layer made of a metal other than aluminum (Al) and copper (Cu);
   at least one oxide layer;
   at least one second metal layer made of a metal other than Al, Cu, and said metal used in said first metal layer; and
   at least one alloy layer made of Al and Cu, wherein said first metal layer, oxide layer, second metal layer, and alloy layer are provided in this order from said piezoelectric substrate.

9. The surface acoustic wave (SAW) device according to claim 1, wherein said oxide layer is a naturally oxidized layer.

10. The surface acoustic wave (SAW) device according to claim 2, wherein said oxide layer is a naturally oxidized layer.

11. The surface acoustic wave (SAW) device according to claim 3, wherein said oxide layer is a naturally oxidized layer.

12. The surface acoustic wave (SAW) device according to claim 4, wherein said oxide layer is a naturally oxidized layer.

13. The surface acoustic wave (SAW) device according to claim 5, wherein said oxide layer is a naturally oxidized layer.

14. The surface acoustic wave (SAW) device according to claim 6, wherein said oxide layer is a naturally oxidized layer.

15. The surface acoustic wave (SAW) device according to claim 8, wherein said oxide layer is a naturally oxidized layer.

16. The surface acoustic wave (SAW) device according to claim 1, wherein said alloy layer is made by sputtering.

17. The surface acoustic wave (SAW) device according to claim 2, wherein said alloy layer is made by sputtering.

18. The surface acoustic wave (SAW) device according to claim 1, wherein said metal layer is made of titanium (Ti).

19. The surface acoustic wave (SAW) device according to claim 2, wherein said metal layer is made of titanium (Ti).

20. The surface acoustic wave (SAW) device according to claim 7, wherein said first metal layer is made of chrome (Cr) and said second metal layer is made of titanium (Ti).

21. The surface acoustic wave (SAW) device according to claim 8, wherein said first metal layer is made of chrome (Cr) and said second metal layer is made of titanium (Ti).

* * * * *